United States Patent
Larsson et al.

(10) Patent No.: US 6,890,632 B2
(45) Date of Patent: May 10, 2005

(54) COATED CUTTING TOOL INSERT

(75) Inventors: Andreas Larsson, Fagersta (SE); Anette Sulin, Fagersta (SE); Lena Pettersson, Ängelsberg (SE)

(73) Assignee: Seco Tools AB, Fagersta (SE)

( * ) Notice: Subject to any disclaimer, the term of this patent is extended or adjusted under 35 U.S.C. 154(b) by 86 days.

(21) Appl. No.: 10/389,738

(22) Filed: Mar. 18, 2003

(65) Prior Publication Data

US 2003/0211367 A1 Nov. 13, 2003

(30) Foreign Application Priority Data

Mar. 20, 2002 (SE) ............................................. 0200870

(51) Int. Cl.$^7$ ................................................. B32B 9/00
(52) U.S. Cl. ...................... 428/216; 51/307; 51/309; 427/419.1; 427/419.2; 427/419.7; 428/336; 428/472; 428/697; 428/698; 428/699; 428/701; 428/702
(58) Field of Search ................................. 428/216, 336, 428/472, 697, 698, 699; 51/307, 309; 427/419.1, 419.2, 419.7

(56) References Cited

U.S. PATENT DOCUMENTS

| | | | | |
|---|---|---|---|---|
| 5,786,069 A | * | 7/1998 | Ljungberg et al. | 428/216 |
| 5,920,760 A | * | 7/1999 | Yoshimura et al. | 428/698 |
| 6,062,776 A | | 5/2000 | Sandman et al. | |
| 6,177,178 B1 | | 1/2001 | Östlund et al. | |
| 6,221,469 B1 | * | 4/2001 | Ruppi | 428/701 |
| 6,261,673 B1 | * | 7/2001 | Reineck et al. | 428/698 |
| 6,344,265 B1 | * | 2/2002 | Blomstedt et al. | 428/336 |
| 6,406,224 B1 | | 6/2002 | Östlund et al. | |
| 6,638,609 B2 | * | 10/2003 | Nordgren et al. | 428/698 |

FOREIGN PATENT DOCUMENTS

| | | |
|---|---|---|
| EP | 1 103 635 A2 | 5/2001 |
| WO | 01/16389 A1 | 3/2001 |

OTHER PUBLICATIONS

U.S. Appl. No. 10/389,737, filed Mar. 18, 2003, Sulin et al.
U.S. Appl. No. 10/392,870, filed Mar. 21, 2003, Ruppi et al.

* cited by examiner

Primary Examiner—Archene Turner
(74) Attorney, Agent, or Firm—Burns, Doane, Swecker & Mathis, L.L.P.

(57) ABSTRACT

Coated cemented carbide inserts (cutting tool), particularly useful for milling at high cutting speeds in steels and milling in hardened steels are characterised by a WC—Co cemented carbide containing NbC and TaC and a W-alloyed binder phase and a coating including a first, innermost layer of $TiC_xN_yO_z$ with equiaxed grains, a second layer of $TiC_xN_yO_z$ with columnar grains and at least one layer of $Al_2O_3$ composed primarily of the κ-phase.

13 Claims, 1 Drawing Sheet

COATED CUTTING TOOL INSERT

FIELD OF THE INVENTION

The present invention relates to a coated cemented carbide material such as an insert (cutting tool), particularly useful for milling at high cutting speeds in steels and milling in hardened steels.

BACKGROUND OF THE INVENTION

In the description of the background of the present invention that follows reference is made to certain structures and methods, however, such references should not necessarily be construed as an admission that these structures and methods qualify as prior art under the applicable statutory provisions. Applicants reserve the right to demonstrate that any of the referenced subject matter does not constitute prior art with regard to the present invention.

During machining of steels, stainless steels and cast irons with coated cemented carbide tools, the cutting edges are worn according to different wear mechanisms, such as chemical wear, abrasive wear and adhesive wear. At high cutting speeds, the amount of heat generated in the cutting zone is considerable and a plastic deformation of the cutting edge may occur, which in turn yields enhanced wear by other mechanisms. The domination of any of the wear mechanisms is determined by the application, and is dependent on both properties of the work piece and applied cutting parameters. In milling applications, the tool life is also often limited by edge chipping caused by so-called comb cracks that form perpendicular to the cutting edge. The cracks originate from the varying thermal and mechanical loads that the cutting edge is subjected to during the intermittent cutting process. This is often even more evident in machining with coolant, which enhances the thermal variations.

Measures can be taken to improve the cutting performance with respect to a specific wear type. However, very often such actions will have a negative effect on other wear properties and successful tool composite materials must be designed as careful optimizations of numerous properties. A simple measure that can be taken to increase the abrasive wear resistance and resistance to plastic deformation is to lower the binder phase content. However, this will also diminish the toughness of the cutting insert which can substantially lower the tool life in applications where factors like vibrations or the presence of a casting or forging skin on the workpiece can put demands on such properties. An alternative way to increase the deformation resistance is to add cubic carbides like TiC, TaC and/or NbC. This will also increase the wear resistance when machining at high cutting edge temperatures. However, this addition has a negative influence on comb crack formation and edge chipping tendencies.

Since it is obviously difficult to improve all tool properties simultaneously, commercial cemented carbide grades have usually been optimized with respect to only one or few of the above mentioned wear types. Consequently they have also been optimized for only specific applications.

U.S. Pat. No. 6,062,776 discloses a coated cutting insert particularly useful for milling of low and medium alloyed steels and stainless steels with raw surfaces such as cast skin, forged skin, hot or cold rolled skin or pre-machined surfaces under unstable conditions. The insert is characterized by a WC—Co cemented carbide with a low content of cubic carbides and a rather low W-alloyed binder phase and a coating including an innermost layer of $TiC_xN_yO_z$ with columnar grains and a top layer of TiN and an inner layer of $\kappa\text{-}Al_2O_3$.

U.S. Pat. No. 6,177,178 describes a coated milling insert particularly useful for milling in low and medium alloyed steels with or without raw surface zones during wet or dry conditions. The insert is characterised by a WC—Co cemented carbide with a low content of cubic carbides and a highly W-alloyed binder phase and a coating including an inner layer of $TiC_xN_yO_z$ with columnar grains, an inner layer of $\kappa\text{-}Al_2O_3$ and, preferably, a top layer of TiN.

WO 01/16389 discloses a coated milling insert particularly useful for milling in low and medium alloyed steels with or without abrasive surface zones during dry or wet conditions at high cutting speed, and milling hardened steels at high cutting speed. The insert is characterized by WC—Co cemented carbide with a low content of cubic carbides and a highly W-alloyed binder phase and a coating including an innermost layer of $TiC_xN_yO_z$ with columnar grains and a top layer of TiN and an inner layer of $\kappa\text{-}Al_2O_3$.

EP 1103635 provides a cutting tool insert particularly useful for wet and dry milling of low and medium alloyed steels and stainless steels as well as for turning of stainless steels. The cutting tool is comprised of a cobalt cemented carbide substrate with a multi-layer refractory coating thereon. The substrate has a cobalt content of 9.0–10.9 wt % and contains 1.0–2.0 wt % TaC/NbC. The coating consists of an MTCVD $TiC_xN_yO_z$ layer and a multi-layer coating being composed of $\kappa\text{-}Al_2O_3$ and $TiC_xN_yO_z$ layers.

SUMMARY OF THE INVENTION

It has now been found that enhanced cutting performance can be obtained by combining many different features of the cutting tool. Preferably for milling, the cutting insert has excellent performance at high cutting speeds in low and medium alloyed steel as well as milling in hardened steels. At these cutting conditions, the cutting tool according to the invention displays improved properties with respect to many of the wear types mentioned earlier.

The cutting tool insert according to the present invention includes a cemented carbide substrate with a relatively low amount of cubic carbides, with a medium to highly W-alloyed binder phase and a fine to medium WC grain size. This substrate is provided with a wear resisting coating comprising an equiaxed $TiC_xN_yO_z$ layer, a columnar $TiC_xN_yO_z$ layer and at least one $\kappa\text{-}Al_2O_3$ layer.

According to a first aspect, the present invention provides a cutting tool insert comprising a cemented carbide body and a coating, the body having a composition comprising 7.9–8.6 wt % Co, 0.5–2.1 wt % of a total amount of cubic carbides of the metals Ta and Nb, the ratio of the weight concentrations of Ta to Nb is 1.0–12.0 and balance WC with a mean intercept length of 0.4–0.9 µm, and the binder phase being alloyed with W corresponding to an S-value of 0.81–0.95, and said coating comprises a first, innermost layer of $TiC_xN_yO_z$ with $0.7 \leq x+y+z \leq 1$, with equiaxed grains and a total thickness <1 µm, a second layer of $TiC_xN_yO_z$ with $0.7 \leq x+y+z \leq 1$, with a thickness of 0.5–7 µm with columnar grains, at least one layer of $Al_2O_3$ primarily composed of the $\kappa$-phase and having a thickness of 0.2–5 µm.

According to a further aspect, the present invention provides a method of making a cutting tool insert, the method comprising forming a cemented carbide body with a composition comprising 7.9–8.6 wt % Co, 0.5–2.1 wt % of a total amount of cubic carbides of the metals Ta and Nb, the ratio of the weight concentrations of Ta to Nb of 1.0–12.0, and balance WC with a mean intercept length in the range 0.4–0.9 µm, and the binder phase being alloyed with W corresponding to an S-value of 0.81–0.95, and applying a coating to the body, the coating comprising a first, innermost layer of $TiC_xN_yO_z$ with $0.7 \leq x+y+z \leq 1$, with equiaxed grains and a total thickness $\leq 1$ μm, a second layer of $TiC_xN_yO_z$ with $0.7 \leq x+y+z \leq 1$, with a thickness of 0.5–7 μm, with columnar grains, at least one layer of $Al_2O_3$ primarily composed of the κ-phase and having a thickness of 0.2–5 μm.

DETAILED DESCRIPTION OF THE INVENTION

Figure 1:
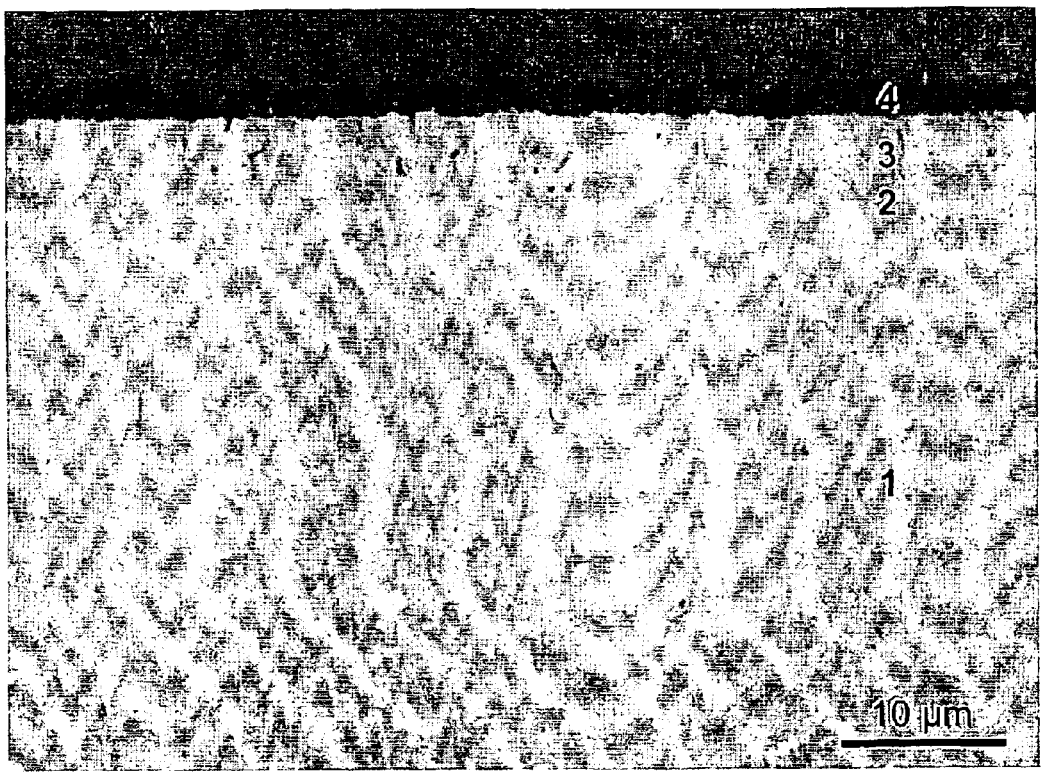
FIG. 1 shows in 2500X a coated cemented carbide substrate according to the present invention.

According to the present invention, a coated cutting tool insert is provided with a cemented carbide body (1) having a composition of 7.9–8.6 wt % Co, preferably 8.0–8.5 wt % Co, most preferably 8.1–8.4 wt % Co; 0.5–2.1 wt %, preferably 0.7–1.8 wt %, most preferably 0.9–1.5 wt % total amount of cubic carbides of the metals Ti, Nb and Ta and balance WC. Ti, Ta and/or Nb may also be replaced by other carbides of elements from groups IVB, VB or VIB of the periodic table. The content of Ti is preferably on a level corresponding to a technical impurity. In a preferred embodiment, the ratio between the weight concentrations of Ta and Nb is within 1.0–12.0, preferably 1.5–11.4, most preferably 3.0–10.5.

The cobalt binder phase is medium to highly alloyed with tungsten. The content of W in the binder phase may be expressed as the S-value=$\sigma$/16.1, where $\sigma$ is the measured magnetic moment of the binder phase in $\mu Tm^3 kg^{-1}$. The S-value depends on the content of tungsten in the binder phase and increases with a decreasing tungsten content. Thus, for pure cobalt, or a binder in a cemented carbide that is saturated with carbon, S=1 and for a binder phase that contains W in an amount that corresponds to the borderline to formation of η-phase, S=0.78.

It has now been found according to the present invention that improved cutting performance is achieved if the cemented carbide body has an S-value within the range 0.81–0.95, preferably 0.82–0.94, most preferably 0.85–0.92.

Furthermore, the mean intercept length of the tungsten carbide phase measured on a ground and polished representative cross section is in the range 0.4–0.9 μm, preferably 0.5–0.8 μm. The intercept length is measured by means of an image analysis on micrographs with a magnification of 10000× and calculated as the average mean value of approximately 1000 intercept lengths.

A coating according to one embodiment includes:

a first, innermost layer of $TiC_xN_yO_z$ (2) with $0.7 \leq x+y+z \leq 1$, preferably z<0.5, more preferably y>x and z<0.2, most preferably y>0.7, with equiaxed grains and a total thickness <1 μm preferably >0.1 μm.

a second layer of $TiC_xN_yO_z$ (3) with $0.7 \leq x+y+z \leq 1$, preferably with z<0.2, x>0.3 and y>0.2, most preferably x>0.4, with a thickness of 0.5–7 μm, preferably 1–6 μm, most preferably 2–6 μm, with columnar grains.

at least one layer of $Al_2O_3$ (4) consisting essentially of the κ-phase. The layer may also contain small amounts of the α-phase as determined by XRD-measurements. The $Al_2O_3$ layer has a thickness of 0.2–5 μm, preferably 0.3–4 μm, and most preferably 0.4–3 μm.

the outermost $Al_2O_3$ layer can be followed by further layers (<1 μm, preferably 0.1–0.5 μm thick) of $TiC_xN_yO_z$, $HfC_xN_yO_z$ or $ZrC_xN_yO_z$ or mixtures thereof with $0.7 \leq x+y+z \leq 1.2$, preferably with y>x and z<0.4, more preferably y>0.4, most preferably y>0.7, but an $Al_2O_3$ layer can also be the outermost layer.

The present invention also relates to a method of making a coated cutting tool with a composition of 7.9–8.6 wt % Co, preferably 8.0–8.5 wt % Co, most preferably 8.1–8.4 wt % Co; 0.5–2.1 wt %, preferably 0.7–1.8 wt %, most preferably 0.9–1.5 wt % total amount of cubic carbides of the metals Ti, Nb and Ta and balance WC. Ti, Ta and/or Nb may also be replaced by other carbides of elements from groups IVB, VB or VIB of the periodic table. The content of Ti is preferably on a level corresponding to a technical impurity. In a preferred embodiment, the ratio between the weight concentrations of Ta and Nb is within 1.0–12.0, preferably 1.5–11.4, most preferably 3.0–10.5.

The desired mean intercept length depends on the grain size of the starting powders and milling and sintering conditions and has to be determined by experiments. The desired S-value depends on the starting powders and sintering conditions and also has to be determined by experiments.

The layer of $TiC_xN_yO_z$ with $0.7 \leq x+y+z \leq 1$, preferably with z<0.2, x>0.3 and y>0.2, most preferably x>0.4, having a morphology of columnar grains, is deposited with MTCVD-technique onto the cemented carbide using acetonitrile as the carbon and nitrogen source for forming the layer in the temperature range of 700–950° C.

The innermost $TiC_xN_yO_z$ layer, the alumina layers and subsequent $TiC_xN_yO_z$, $HfC_xN_yO_z$ or $ZrC_xN_yO_z$ layers if any are deposited according to known technique.

The invention also relates to the use of cutting tool inserts according to above for dry milling at high cutting speeds in steels and dry milling in hardened steels at cutting speeds of 75–400 m/min with mean chip thickness values of 0.04–0.20 mm, depending on cutting speed and insert geometry.

EXAMPLE 1

Grade A: A cemented carbide substrate in accordance with the invention with the composition 8.2 wt % Co, 1.2 wt % TaC, 0.2 wt % NbC and balance WC, with a binder phase alloyed with W corresponding to an S-value of 0.87 was produced by conventional milling of the powders, pressing of green compacts and subsequent sintering at 1430° C. Investigation of the microstructure after sintering showed that the mean intercept length of the tungsten carbide phase was 0.65 μm. The substrate was coated in accordance with the invention with four subsequent layers deposited during the same coating cycle. The first layer was a 0.2 μm thick $TiC_xN_yO_z$ layer with z<0.1 and y>0.6, having equiaxed grains. The second layer was 4.1 μm of columnar $TiC_xN_yO_z$ deposited at 835–850° C. with acetonitrile as carbon and nitrogen source, yielding an approximated carbon to nitrogen ratio x/y=1.5 with z<0.1. The third layer was a 1.7 μm thick layer of $Al_2O_3$ deposited at approximately 1000° C. and consisting essentially of the κ-phase. Analysis of the $Al_2O_3$ layer with XRD showed minor traces of α-$Al_2O_3$, but only to a level where the intensity ratio of the (012) α-$Al_2O_3$ and the (022) κ-$Al_2O_3$ reflections were less than ⅓. Finally a layer of equiaxed nitrogen rich $TiC_xN_yO_z$ with z<0.1 and y>0.8 was deposited to a thickness of 0.2 μm.

Grade B: A substrate according to grade A (according to the invention) was coated with a multilayer coating with seven layers of $TiC_xN_yO_z$ (z<0.1). All layers were deposited using conventional CVD at 1010° C. with methane and nitrogen gas as carbon and nitrogen sources. The grain morphology of each layer showed equiaxed features. The first layer was 3.1 μm of $TiC_xN_yO_z$ with a composition close to x/y=1.6. The thickness of each of the following six layers was 0.8 μm, and the composition alternated between estimated x/y ratios of 4 and 0.25, respectively.

Grade C: A substrate with composition 7.1 wt % Co, 0.5 wt % TaC, 0.1 wt % NbC and balance WC, a binder phase alloyed with W corresponding to an S-value of 0.94, and a mean intercept length of WC in the sintered body of 1.1 μm was combined with a coating according to Grade A (according to the invention).

| Operation | Face milling |
|---|---|
| Cutter diameter | 125 mm |
| Work piece | Bar, 600 mm × 75 mm |
| Material | SS1672, 185 HB |
| Insert type | SEKN1203 |
| Cutting speed | 300 m/min |
| Feed | 0.25 mm/tooth |
| Number of teeth | 1 |
| Depth of cut | 2.5 mm |
| Width of cut | 75 mm |
| Coolant | Yes |

| Results | Tool life (min) |
|---|---|
| Grade A (grade according to invention) | 14 |
| Grade B (substrate according to invention) | 10 |
| Grade C (coating according to invention) | 8 |

The tool life was limited due to destruction of the cutting edge as consequence of the propagation of thermal cracks. This test shows that the combination of the substrate and coating according to the invention exhibits longer tool life than the same substrate in combination with prior art coating or the coating in the invention combined with a prior art substrate.

EXAMPLE 2

Grade D: A commercial cemented carbide cutting insert from a competitor with the composition 8.8 wt % Co, 1.8 wt % TaC, 0.3 wt % NbC, 0.3 wt % TiC and balance WC. The binder phase is alloyed with W corresponding to an S-value of 0.90, and the mean intercept length of the WC is 0.9 μm. The insert is coated with 2.5 μm of $TiC_xN_yO_z$, 1.5 μm of $Al_2O_3$ and 0.4 μm of $TiC_xN_yO_z$.

| Operation | Face milling |
|---|---|
| Cutter diameter | 125 mm |
| Work piece | Bar, 600 mm × 26 mm |
| Material | SS2541, 240 HB |
| Insert type | SEKN1203 |
| Cutting speed | 200 m/min |
| Feed | 0.2 mm/tooth |
| Number of teeth | 1 |
| Depth of cut | 2.5 mm |
| Width of cut | 26 mm |
| Coolant | Yes |

| Results | Tool life (min) |
|---|---|
| Grade A (grade according to invention) | 20 |
| Grade C (substrate according to invention | 12 |
| Grade D (prior art) | 17 |

The tool life was limited due to destruction of the cutting edge as consequence of propagation of comb cracks due to varying thermal and mechanical loads. In this test the coatings of the compared grades were of similar type and the differences in tool life is principally a consequence of constitutional differences between the tested substrates. The test shows that the cemented carbide substrate according to the invention exhibits longer tool life than the two grades containing less and more binder phase.

EXAMPLE 3

Grade E: A commercial cemented carbide cutting insert with composition 9.4 wt % Co, 7.2 wt % TaC, 0.1 wt % NbC, 3.4 wt % TiC and balance WC. The binder phase is alloyed with W corresponding to an S-value of 0.85, and the mean intercept length of the WC is 0.7 μm. The insert is coated with a 1.5 μm thick $Ti_xAl_{1-x}N$ layer.

| Operation | Copy milling |
|---|---|
| Cutter diameter | 35 mm |
| Work piece | Bar, 350 mm × 270 mm |
| Material | SS2242, 38 HRC |
| Insert type | RPHT1204 |
| Cutting speed | 200 m/min |
| Feed | 0.22 mm/tooth |
| Number of teeth | 3 |
| Depth of cut | 2 mm |
| Width of cut | 5–32 mm |
| Coolant | No |

| Results | Tool life (mill) |
|---|---|
| Grade A (grade according to invention) | 65 |
| Grade B (substrate according to invention) | 25 |
| Grade E (prior art) | 41 |

The tool life was limited by flank wear and edge chipping. This test shows that compared to straight $TiC_xN_yO_z$ based coatings, the coating according to the invention gives better protection against abrasive wear and cracking due to thermal loads. The shorter tool life of Grade E shows the negative effect of high cubic carbide content on cutting edge strength and edge chipping resistance.

EXAMPLE 4

| Operation | Face milling |
|---|---|
| Cutter diameter | 125 mm |
| Work piece | Bar, 300 mm × 80 mm |
| Material | SS2244, 48 HRC |
| Insert type | SEKN1203 |
| Cutting speed | 200 m/min |
| Feed | 0.15 mm/tooth |
| Number of teeth | 1 |
| Depth of cut | 2.5 mm |
| Width of cut | 40 mm |
| Coolant | No |

| Results | Tool life (min) |
|---|---|
| Grade A (grade according to invention) | 15 |
| Grade C (coating according to invention) | 7 |

In this test, the tool life is limited by edge chipping and cracking leading to rupture of the cutting edge. The differences in tool life show the effect of a smaller grain size in combination with a slightly higher Co content. These measures give a somewhat better plastic deformation resistance of the cutting edge with maintained toughness properties.

The described embodiments of the present invention are intended to be illustrative rather than restrictive, and are not intended to represent every possible embodiment of the present invention. Various modifications can be made to the disclosed embodiments without departing from the spirit or scope of the invention as set forth in the following claims, both literally and in equivalents recognized in law.

We claim:

1. A cutting tool insert comprising a cemented carbide body and a coating, the body having a composition comprising 8.0–8.5 wt % Co, 0.5–2.1 wt % of a total amount of cubic carbides of the metals Ta and Nb, the ratio of the weight concentrations of Ta to Nb is 1.0–12.0, and balance WC, with a mean intercept length of 0.4–0.9 μm, and the binder phase being alloyed with W corresponding to an S-value of 0.82–0.94, and said coating comprises a first, innermost layer of $TiC_xN_yO_z$ with $0.7 \leq x+y+z \leq 1$, with equiaxed grains and a total thickness <1 μm, a second layer of $TiC_xN_yO_z$ with $0.7 \leq x+y+z \leq 1$, with a thickness of 0.5–7 μm with columnar grains, at least one layer of $Al_2O_3$ primarily composed of the κ-phase and having a thickness of 0.2–5 μm.

2. The cutting tool insert according to claim 1, wherein the body comprises 0.7–1.8 wt % of a total amount of cubic carbides, the ratio of the weight concentrations of Ta to Nb is 1.5–11.4, the mean intercept length of 0.5–0.8 μm and the coating comprises the first innermost layer of $TiC_xN_yO_z$ with $z \leq 0.5$, the second $TiC_xN_yO_z$ layer with $z<0.2$, $x>0.3$ and $y>0.2$ and a thickness of 1–6 μm, and at least $Al_2O_3$ layer with a thickness of 0.3–4 μm.

3. The cutting tool according to claim 2, comprising the first innermost $TiC_xN_yO_z$ layer with $y>x$ and $z<0.2$, and the second $TiC_xN_yO_z$ layer with $x>0.4$.

4. The cutting tool insert according to claim 1, further comprising an outer layer of $TiC_xN_yO_z$, $HfC_xN_yO_z$ or $ZrC_xN_yO_z$ or mixtures thereof with $0.7 \leq x+y+z \leq 1.2$.

5. The cutting tool insert according to claim 4, wherein $y>x$ and $z<0.4$.

6. The cutting tool insert according to claim 5, wherein $y>0.4$.

7. A method of making a cutting tool insert, the method comprising forming a cemented carbide body with a composition comprising 8.0–8.5 wt % Co, 0.5–2.1 wt % of a total amount of cubic carbides of the metals Ta and Nb, the ratio of the weight concentrations of Ta to Nb of 1.0–12.0, and balance WC with a mean intercept length in the range 0.4–0.9 μm, and the binder phase being alloyed with W corresponding to an S-value of 0.82–0.94, and applying a coating to the body, the coating comprising a first, innermost layer of $TiC_xN_yO_z$ with $0.7 \leq x+y+z \leq 1$, with equiaxed grains and a total thickness <1 μm, a second layer of $TiC_xN_yO_z$ with $0.7 \leq x+y+z \leq 1$, with a thickness of 0.5–7 μm, with columnar grains, at least one layer of $Al_2O_3$ primarily composed of the κ-phase and having a thickness of 0.2–5 μm.

8. The method of claim 7, wherein the body is formed with a composition comprising 0.7–1.8 wt % of a total amount of cubic carbides, the ratio of Ta to Nb is 1.5–11.4, the mean intercept length of 0.5–0.8 μm, applying the coating with the first innermost layer of $TiC_xN_yO_z$ with $z<0.5$, the second layer of $TiC_xN_yO_z$ with $z<0.2$, $x>0.3$ and $y>0.2$, and a thickness of 1–6 μm, and the at least one $Al_2O_3$ layer with a thickness of 0.3–4 μm.

9. The method of claim 8, comprising applying the coating comprising the first innermost $TiC_xN_yO_z$ layer with $y>x$ and $z<0.2$, and the second $TiC_xN_yO_z$ layer with $x>0.4$.

10. The method of claim 7, comprising depositing an outer layer of $TiC_xN_yO_z$, $HfC_xN_yO_z$ or $ZrC_xN_yO_z$ or mixtures thereof with $0.7 \leq x+y+z \leq 1.2$.

11. The method of claim 10, wherein $y>x$ and $z<0.4$.

12. The method of claim 11, wherein $y>0.4$.

13. A method of using the cutting tool insert of claim 1, the method comprising dry milling steel at a cutting speed of 75–400 m/min at a mean chip thickness of 0.04–0.2 mm.

* * * * *